(12) United States Patent
Ka

(10) Patent No.: US 6,407,962 B1
(45) Date of Patent: Jun. 18, 2002

(54) MEMORY MODULE HAVING DATA SWITCHER IN HIGH SPEED MEMORY DEVICE

(75) Inventor: Soon-Taeg Ka, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 101 days.

(21) Appl. No.: 09/617,535

(22) Filed: Jul. 14, 2000

(30) Foreign Application Priority Data

Jul. 14, 1999 (KR) ............................................ 99-28436

(51) Int. Cl.⁷ ................................................. G11C 8/00
(52) U.S. Cl. ................... 365/233; 365/230.06; 365/240
(58) Field of Search ............................ 365/233, 230.06, 365/236, 240, 194

(56) References Cited

U.S. PATENT DOCUMENTS 5,703,828 A * 12/1997 Park et al. ............. 365/189.04
5,715,211 A    2/1998 Toda
6,314,033 B1 * 11/2001 Sugamoto et al. ...... 365/189.01

FOREIGN PATENT DOCUMENTS

GB          2348722        10/2000    ............ G11C/7/10

* cited by examiner

Primary Examiner—A. Zarabian
(74) Attorney, Agent, or Firm—Jacobson Holman, PLLC

(57) ABSTRACT

In a memory module having a plurality of memory chips and a plurality of data switchers on one board, wherein each data switcher is selectively turned on or off in response to a switcher control signal to connect corresponding memory chip with a common data bus line, an apparatus for generating the switcher control signal includes: a plurality of shift counting units for shift counting a write command signal in response to an internal clock signal and a reset signal, to generate a plurality of shift counting signals; a switcher enable control signal generator for receiving the shift counting signals to generate a switcher enable control signal for enabling the switcher control signal during a predetermined time corresponding to a burst length; a pull down driver for pulling down the switcher control enable signal to generate a pull-down signal; and an output unit for outputting the switcher control signal in response to the pull-down signal.

24 Claims, 10 Drawing Sheets

MEMORY MODULE HAVING DATA SWITCHER IN HIGH SPEED MEMORY DEVICE

FIELD OF THE INVENTION

The present invention relates to a semiconductor memory device; and, more particularly, to a memory module having a data switcher in a double data rate (DDR) synchronous dynamic random access memory (DRAM) device, which is capable of reducing loads of a common data bus line.

DESCRIPTION OF THE PRIOR ART

For achieving a high speed of operation in a dynamic random access memory (DRAM), synchronous DRAM (SDRAM) has been developed which operates in synchronization with an external clock. The SDRAM includes a single data rate (SDR) SDRAM, and a double data rate (DDR) SDRAM.

While the SDRAM operates in synchronization with rising edges of an external clock, the DDR SDRAM operates in synchronization with rising and falling edges of an external clock. Therefore, compared with the SDR SDRAM, the DDR SDRAM can achieves a higher speed of operation without increasing a frequency of the external clock.

FIG. 1 is a block diagram showing a conventional memory module having a plurality of memory chips.

As shown, a conventional memory module is provided by incorporating a plurality of memory chips 11 to 13 and a memory controller 14 on one board 10. The memory chips 11 to 13 are connected to a common data bus line such as a global input/output line. In a read operation, when a specific memory chip is selected in response to a chip select signal which is outputted from the memory controller 14, data stored in the selected memory chip is outputted to an external circuit via the common data bus line.

However, when one memory chip is selected, unselected memory chips are still being connected to the common data bus line, so that loads of the common data bus line are increased. Especially, in a high speed memory device such as DDR SDRAM using a high frequency, the increased loads deteriorate a characteristic of operation speed.

SUMMARY OF THE INVENTION

It is, therefore, an object of the present invention to provide a high speed memory device having a data switcher, in which loads of a common data bus line are reduced.

In accordance with an aspect of the present invention, there is provided an apparatus for generating a switcher control signal in a memory module having a plurality of memory chips and a plurality of data switchers on one board, each data switcher being selectively turned on or off in response to the switcher control signal to connect corresponding memory chip with a common data bus line, comprising: a plurality of shift counting means for shift counting a write command signal in response to an internal clock signal and a reset signal, to generate a plurality of shift counting signals; a switcher enable control signal generating means for receiving the shift counting signals to generate a switcher enable control signal for enabling the switcher control signal during a predetermined time corresponding to a burst length; a pull down driving means for pulling down the switcher control enable signal to generate a pull-down signal; and an output means for outputting the switcher control signal in response to the pull-down signal.

In accordance with another aspect of the present invention, there is provided a memory module used in a high speed memory device, comprising: a plurality of double data rate (DDR) synchronous dynamic random access memory (SDRAM) chips having a switcher control signal generator for generating a switcher control signal; and a plurality of data switchers, wherein each data switcher is selectively turned on or off in response to the switcher control signal to connect corresponding memory chip with a command data bus line, wherein each data switcher including: a plurality of shift counting means for shift counting a write command signal in response to an internal clock signal and a reset signal, to generate a plurality of shift counting signals; a switcher enable control signal generating means for receiving the shift counting signals to generate a switcher enable control signal for enabling the switcher control signal during a predetermined time corresponding to a burst length; a pull down driving means for pulling down the switcher control enable signal to generate a pull-down signal; and an output means for outputting the switcher control signal in response to the pull-down signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
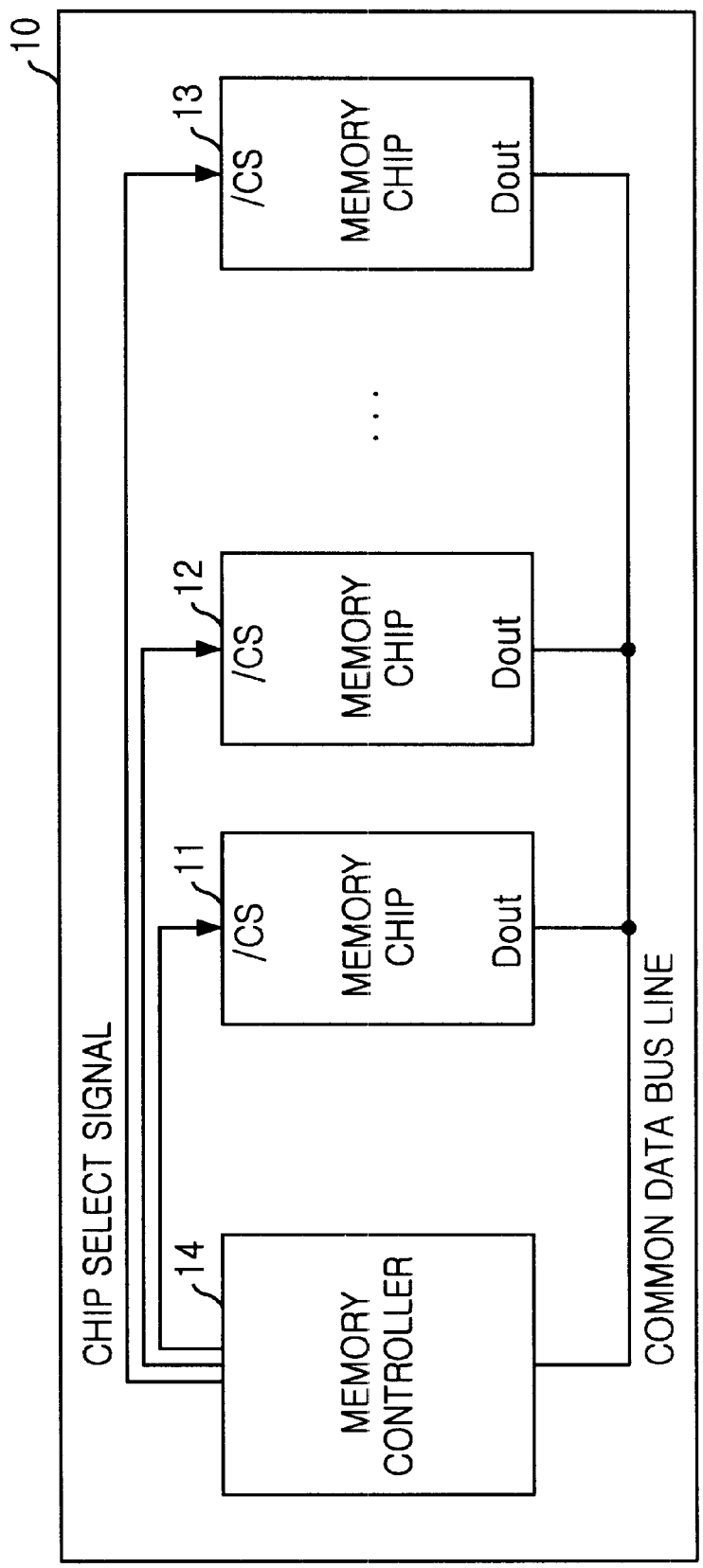
FIG. 1 is a block diagram showing a conventional memory module.
Figure 2:
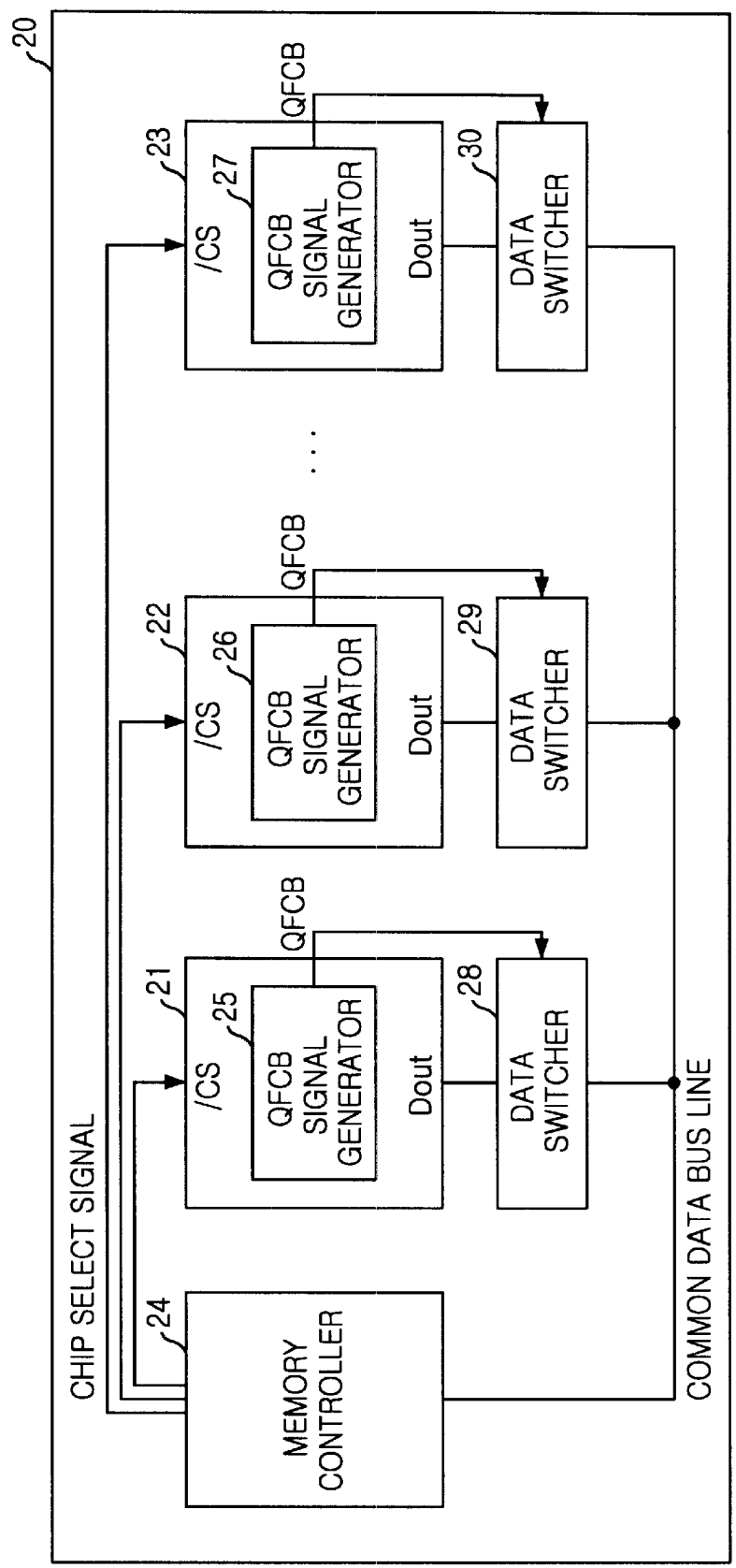
FIG. 2 is a block diagram illustrating a memory module having a data switcher in accordance with the present invention.

FIG. 2 is a block diagram illustrating a memory module having a data switcher in accordance with the present invention, which is applicable to a high speed memory device such as a DDR SDRAM.

Referring to FIG. 2, a memory module includes a plurality of memory chips 21 to 23 having QFCB signal generators 25 to 27, a memory controller 24 and a plurality of data switchers 28 to 30 for selectively connecting a data output terminal of the memory chip to a common data bus line in response to a switcher control signal QFCB.

That is, in a read or write operation, if one memory chip 21 is selected in response to a chip select signal outputted from the memory controller 24, only the data switcher 28 should be activated, or turned on. On the contrary, data switchers 29 to 30 coupled to unselected memory chips 22 to 23 should be inactivated, or turned off. At this time, the switcher control signal, or so-called data FET control bar (hereinafter, referred to as QFCB) signal, is employed in order to activate or inactivate the data switchers 25 to 27. The QFCB signal is a low active signal. Each QFCB signal is generated from each QFCB signal generator 25 to 27 embedded in each memory chip 21 to 23. The QFCB signal is enabled to a low level only when data is inputted/outputted from/to an external circuit.

Figure 3:
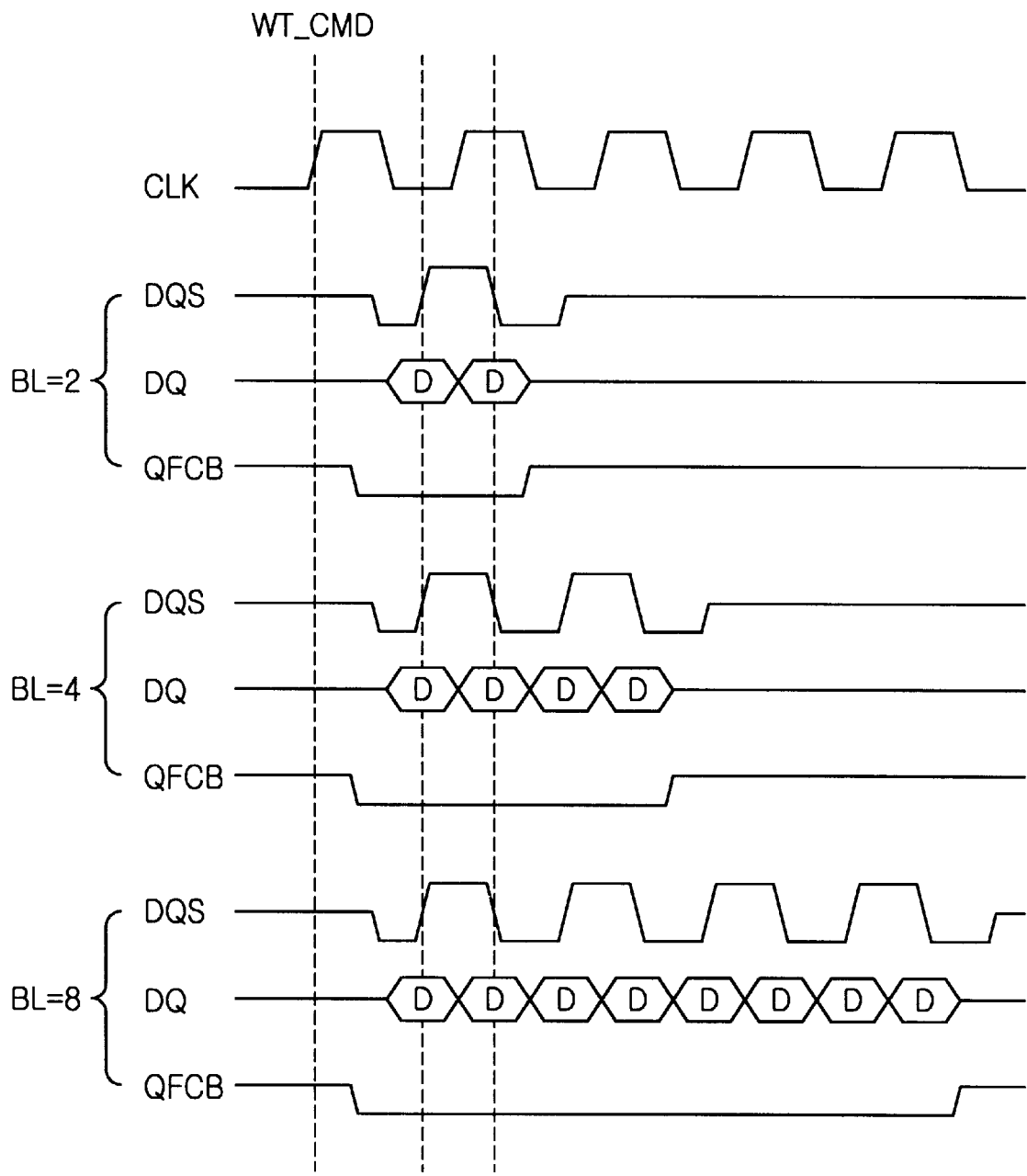
FIG. 3 is a timing chart of QFCB signals according to various burst lengths in a write operation.

FIG. 3 is a timing chart of QFCB signals according to various burst lengths in a write operation. Here, a reference symbol CLK represents an internal clock, DQS a data strobe signal, and DQ a data, respectively. For the sake of convenience, a detailed description about the data strobe signal DQS will be omitted, since the data strobe signal DQS is well known to those skilled in the art.

As shown, the QFCB signal is enabled from a high impedance state to a low-level state in response to a write command WT_CMD and the QFCB signal is then disabled from the low-level state to a high impedance state just after a data input operation is completed.

At this time, it should be noted that the QFCB signal is maintained at an enabled state while the data are inputted according to corresponding burst length. Furthermore, if a previous write command is interrupted by another write command signal, the QFCB signal should be disabled. Also, if a second write command signal occurs without any gap, the QFCB signal should not be disabled until data is inputted in response to the second write command signal.

Figure 4:
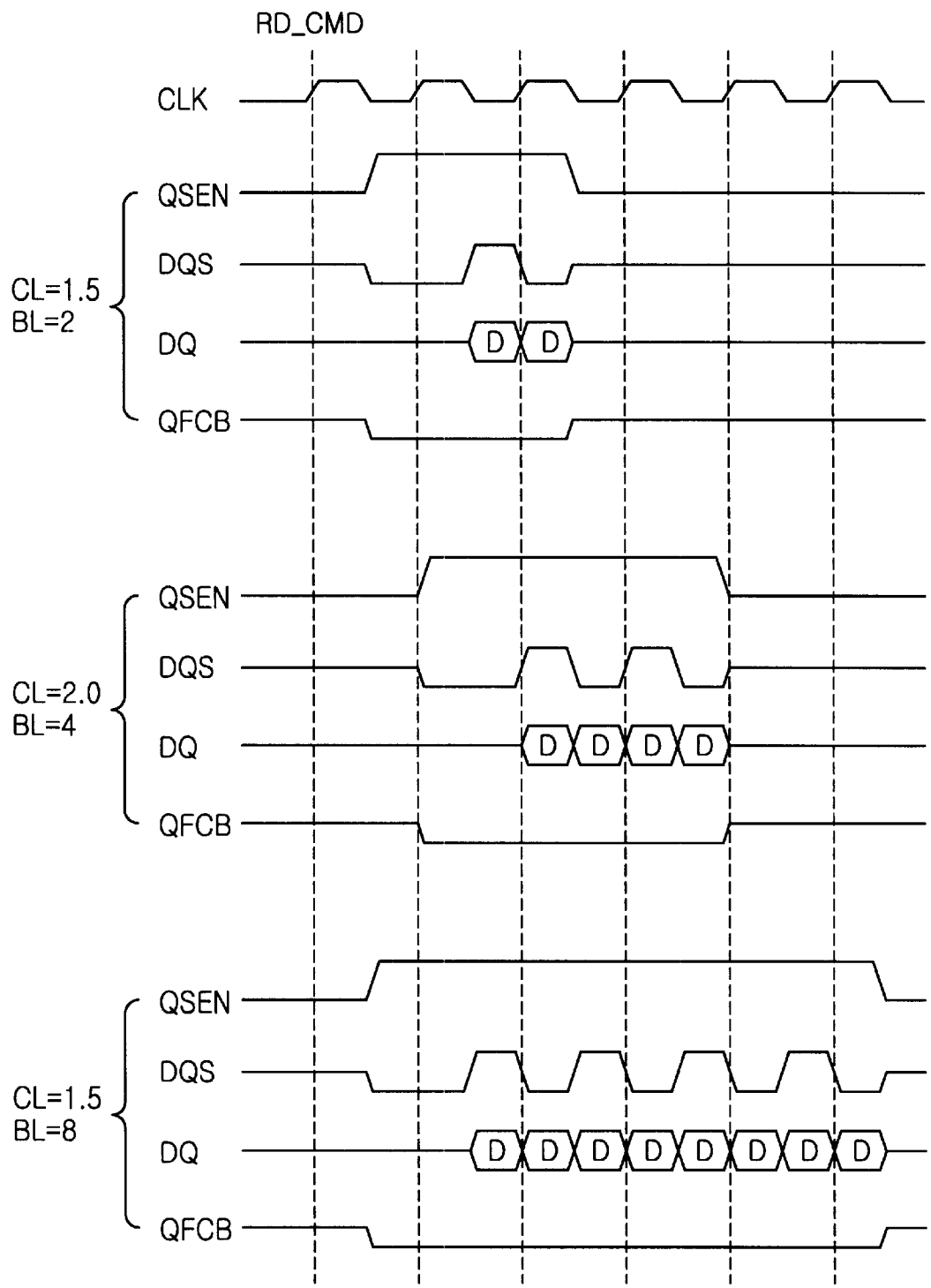
FIG. 4 is a timing chart diagram of QFCB signal according to various burst lengths and various CAS latencies in a read operation.

FIG. 4 is a timing chart of QFCB signals according to various burst lengths and various column address strobe (CAS) latencies in a read operation.

As shown, when a read command signal RD_CMD occurs, a data strobe enable signal QSEN is enabled to a high-level state before one period of corresponding column address strobe (CAS) latency and the data strobe signal DQS becomes a preamble state in response to the data strobe enable signal QSEN. Then, the data strobe signal DQS is toggled according to data output and the data strobe signal DQS is disabled to a high impedance just after a data output operation is completed.

At this time, the QFCB signal is enabled from a high impedance state to a low-level state when the data strobe signal DQS becomes a preamble state, and then, the QFCB signal is disabled from the low-level state to a high impedance state after the data strobe signal DQS is disabled to a preamble state. As can be seen, an inverted data strobe enable signal QSEN can be used as the QFCB signal for a read operation It should be noted that the QFCB signal is maintained at an enabled state while the data are outputted according to corresponding burst length. Furthermore, if a previous read command is interrupted by another read command signal, the QFCB signal should be disabled. Also, if a second read command signal occurs without any gap, the QFCB signal should not be disabled until data is outputted in response to the second read command signal.

Figure 5:
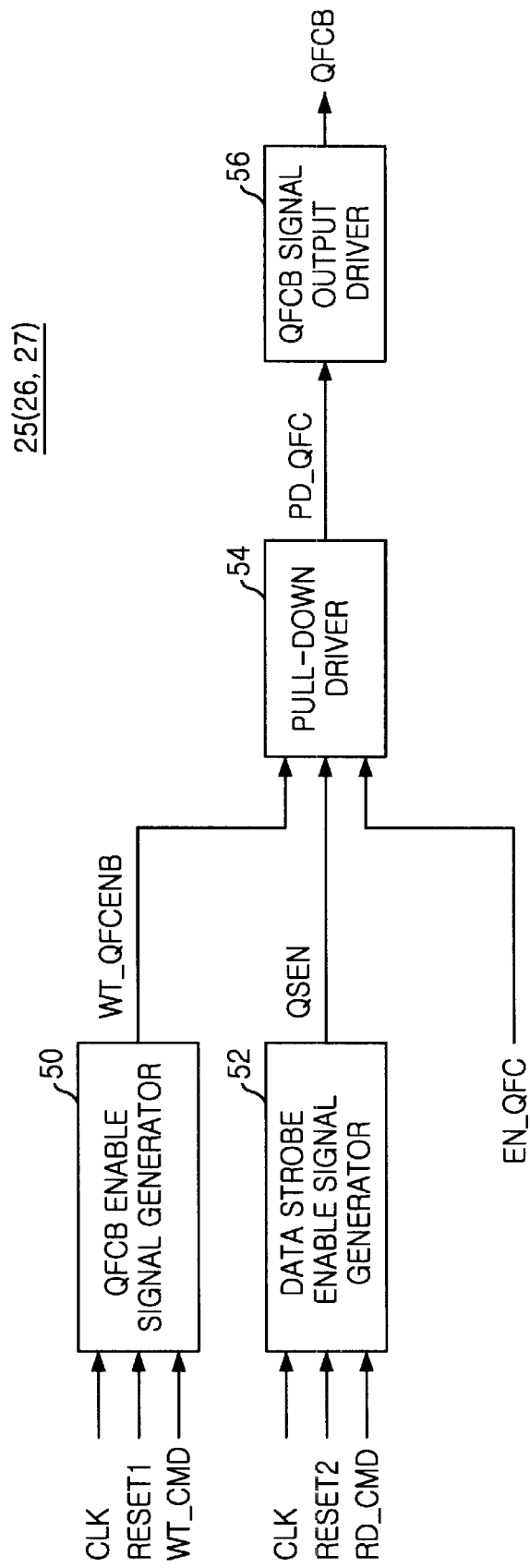
FIG. 5 is a block diagram illustrating a QFCB signal generator in accordance with the present invention.

FIG. 5 is a block diagram illustrating a QFCB signal generator shown in FIG. 2.

Referring FIG. 5, the QFCB signal generator includes a QFCB enable signal generator 50, a data strobe enable signal generator 52, a pull-down driver 54, and a QFCB output driver 56.

The QFCB enable signal generator 50 receives an internal clock CLK, a reset signal RESET1 and a write command signal WT_CMD, to generate a QFCB enable signal WT_QFCENB for enabling the QFCB signal for a predetermined period in a write operation. Here, the write command signal WT_CMD is a pulse signal which is generated in synchronization with a rising edge of the internal clock CLK by a command decoder (not shown), and the reset signal RESET1 is a pulse signal which is generated when a write operation is interrupted due to an external signal such as a precharge command.

The data strobe enable signal generator 52 receives the internal clock CLK, a reset signal RESET2 and a read command signal RD_CMD, to generate a data strobe enable signal QSEN for enabling the data strobe signal DQS according to corresponding CAS latency in a read operation. Here, the reset signal RESET2 is a pulse signal which is generated when a read operation is interrupted due to an external signal such as a precharge command or a burst termination command.

The pull-down driver 54 pulls down the QFCB enable signal WT_QFCENB and the data strobe enable signal QSEN, to generate a pull-down signal PD_QFC. The pull-down signal PD_QFC is a high active signal.

At this time, in an extended mode register set (EMRS) of the DDR SDRAM, in case where it is determined to employ the QFCB signal, a control signal EN_QFC is set to a high level, and in case where it is determined not to employ the QFCB signal, the control signal EN_QFC is set to a low level.

The QFCB signal output driver 56 enables the QFCB signal to a low level in response to the pull-down signal PD_QFC.

In the write operation, the QFCB enable signal WT_QFCENB is generated in response to the write command signal WT_CMD and the pull-down driver 54 enables the pull-down signal PD_QFC to a high level. Then, the QFCB signal output driver 56 enables the QFCB signal to a low level in response to the pull-down signal PD_QFC. When the write operation is completed, the pull-down signal is disabled and the QFCB signal is disabled to a high impedance state.

Similarly, in the read operation, the data strobe enable signal QSEN is generated in response to the read command signal RD_CMD and the pull-down driver 54 enables the pull-down signal PD_QFC to a high level. Then, the QFCB signal output driver 56 enables the QFCB signal to a low level in response to the pull-down signal PD_QFC. When the read operation is completed, the pull-down signal is disabled and the QFCB signal is disabled to a high impedance state.

Hereinafter, a structure and operation of the QFCB signal generator will be described in detail with reference to accompanying drawings.

Figure 6:
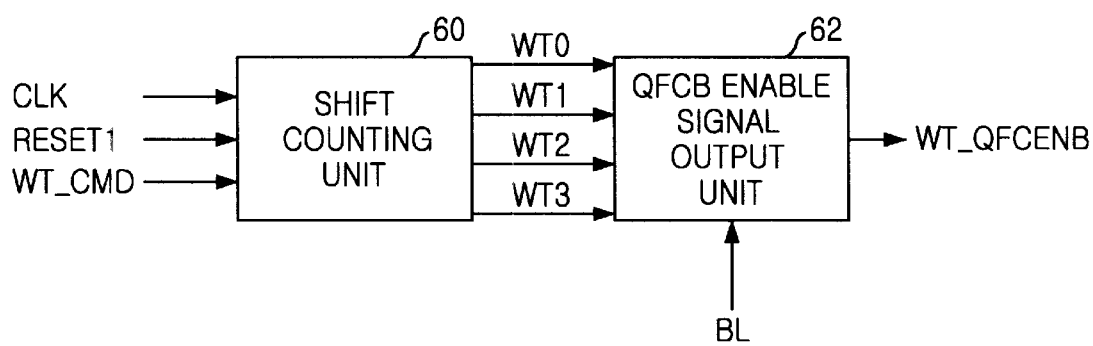
FIG. 6 is a block diagram illustrating a QFCB enable signal generator shown in FIG. 5.

FIG. 6 is a block diagram illustrating a QFCB enable signal generator shown in FIG. 5.

As shown, the QFCB enable signal generator 50 includes a shift counting unit 60 and a QFCB enable signal output unit 62.

The shift counting unit 60 receives the internal clock CLK, the reset signal RESET1 and the write command signal WT_CMD and performs a shift counting operation at every clock, to generate shift counting signals WT0, WT1, WT2 and WT3.

The QFCB enable signal output unit 62 combines the shifting counting signals WT0, WT1, WT2 and WT3, to generate the QFCB enable signal WT_QFCENB according to corresponding burst length.

Figure 7:
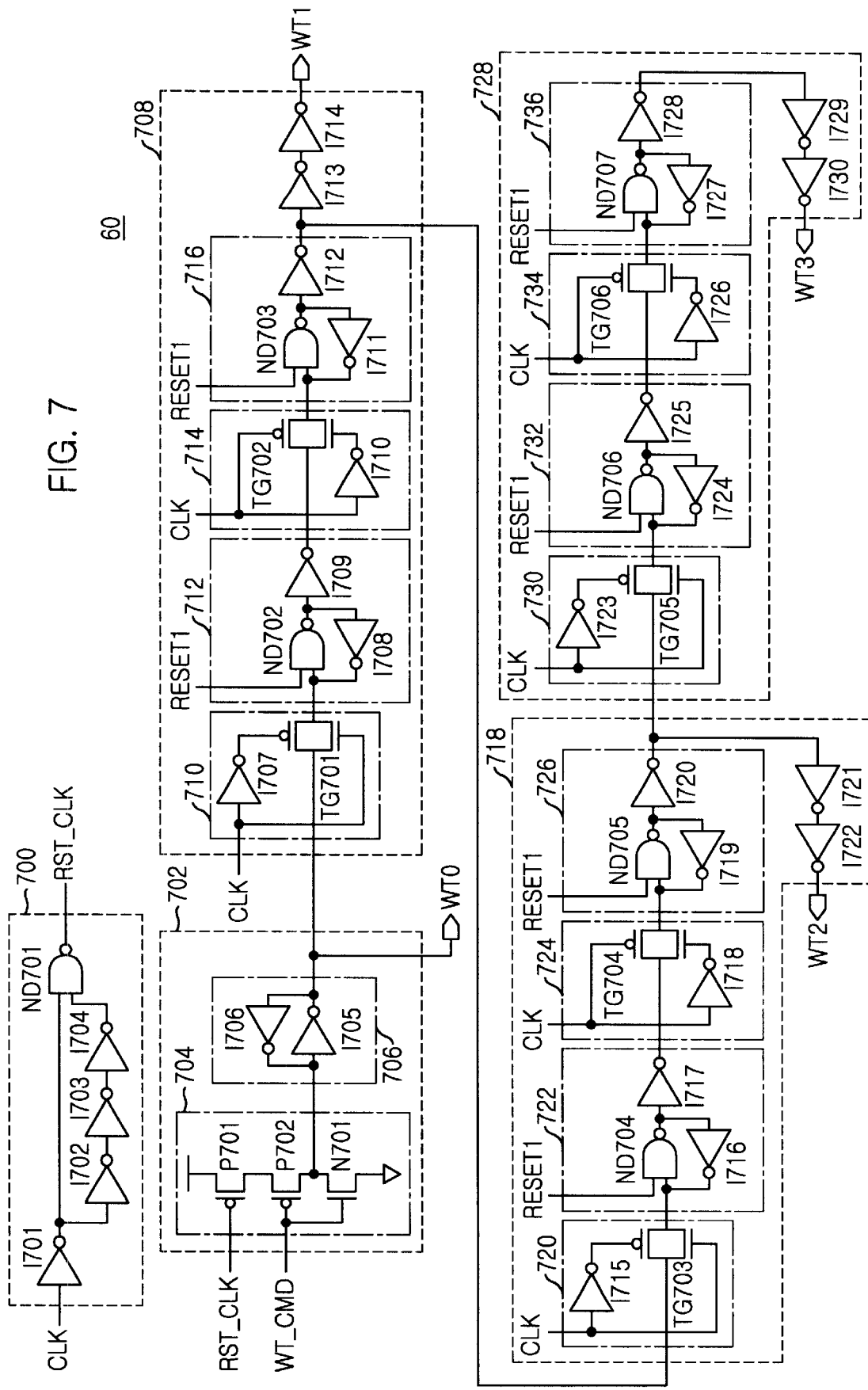
FIG. 7 is a circuit diagram illustrating a shift counting unit shown in FIG. 6.

FIG. 7 is a circuit diagram illustrating a shift counting unit shown in FIG. 6.

As shown, the shift counting unit 60 includes a reset clock generator 700, a first shift counter 702, a second shift counter 708, a third shift counter 718, and a fourth shift counter 728.

The reset clock generator 700 receives the internal clock CLK to generate the reset clock RST_CLK in synchronization with a falling edge of the internal clock CLK. The reset clock RST_CLK is used to reset a shift counting signal at a falling edge of the internal clock CLK after the write command signal WT_CMD is enabled.

The reset clock generator 700 includes an inverter I701 for inverting the internal clock CLK to generate an inverted internal clock, a plurality of inverters I702 to I704 for inverting and delaying the inverted internal clock to generate an inverted and delayed internal clock, and a NAND gate ND701 for NANDing the inverted internal clock and the inverted and delayed internal clock to generate the reset clock RST_CLK.

The first shift counter 702 includes a signal input unit 704 for receiving the reset clock RST_CLK and the write command signal WT_CMD and a latch unit 706 for latching an output signal of the signal input unit 704, to output the first shift counting signal WT0. The first shift counting signal wT0 is enabled to a high level during one period of the internal clock CLK.

The signal input unit 704 includes a PMOS transistor P701 whose source is coupled to a power terminal and whose gate receives the reset clock RST_CLK, a PMOS transistor P702 whose source is coupled to a drain of the PMOS transistor P701 and whose gate receives the write command signal WT_CMD, and an NMOS transistor N701 whose drain is coupled to a drain of the PMOS transistor P702, whose source is coupled to a ground terminal and whose gate receives the write command signal WT_CMD. The latch unit 706 is preferably implemented with two inverters I705 and I706 that are cross-coupled to each other.

When the write command occurs, the PMOS transistor P702 is turned off and the NMOS transistor N701 is turned on, so that a low level signal is outputted from the signal input unit 704. Therefore, a high level signal is latched and outputted from the latch unit 706. That is, the first shift counting signal WT0 is enabled to the high level. Then, the first shift counting signal WT0 is disabled to a low level in response to the reset clock RST_CLK, shown in FIG. 9.

Next, the second shift counter 708 includes two signal transfer units 710 and 714, two latch units 712 and 716 and a plurality of inverters I712 and I713.

A first signal transfer unit 710 transfers the first shift counting signal WT0 in response to a rising edge of the internal clock CLK. The first signal transfer unit 710 can be preferably implemented with an inverter I707 for inverting the internal clock CLK and a transfer gate TG701 responsive to the internal clock CLK of a high level.

A first latch unit 712 latches and outputs the first shift counting signal WT0 in response to the reset signal RESET1. The first latch unit 712 includes a NAND gate having an input terminal receiving the reset signal RESET1 and the other input terminal receiving an output signal of the first signal transfer unit 710, an inverter I708 whose input terminal is coupled to an output terminal of the NAND gate ND702 and whose output terminal is coupled to the other terminal of the NAND gate ND702, and an inverter I709 for inverting an output signal of the NAND gate ND702.

A second signal transfer unit 714 transfers an output signal of the first latch unit 712 in response to a falling edge of the internal clock CLK. The second signal transfer unit 714 can be implemented with an inverter for inverting the internal clock CLK and a transfer gate TG703 responsive to the internal clock CLK of a low level.

A second latch unit 716 latches and outputs the output signal of the second signal transfer unit 714 in response to the reset signal RESET1. The second latch unit 716 has the same structure as the first latch unit 712. Then, an output signal of the second latch unit 716 is delayed for a predetermined time through a plurality of inverters I713 and I714, to output the second shift counting signal WT1. The second shift counting signal WT1 is enabled to a high level during a second period of the internal clock CLK.

The third shift counter 718 receives an output signal of the second latch unit 716 to generate the third shift counting signal WT2, which is enabled during a third period of the internal clock CLK. The fourth shift counter 728 receives an output signal of a latch unit 726 to generate a fourth shift counting signal WT3, which is enabled during a fourth period of the internal clock CLK.

The third and fourth shift counters 718 and 728 has the same structure as the second control circuit 708. Therefore, for the sake of simplicity in explanation, a detail description about the structures of the third and fourth shift counters will be omitted.

Figure 8:
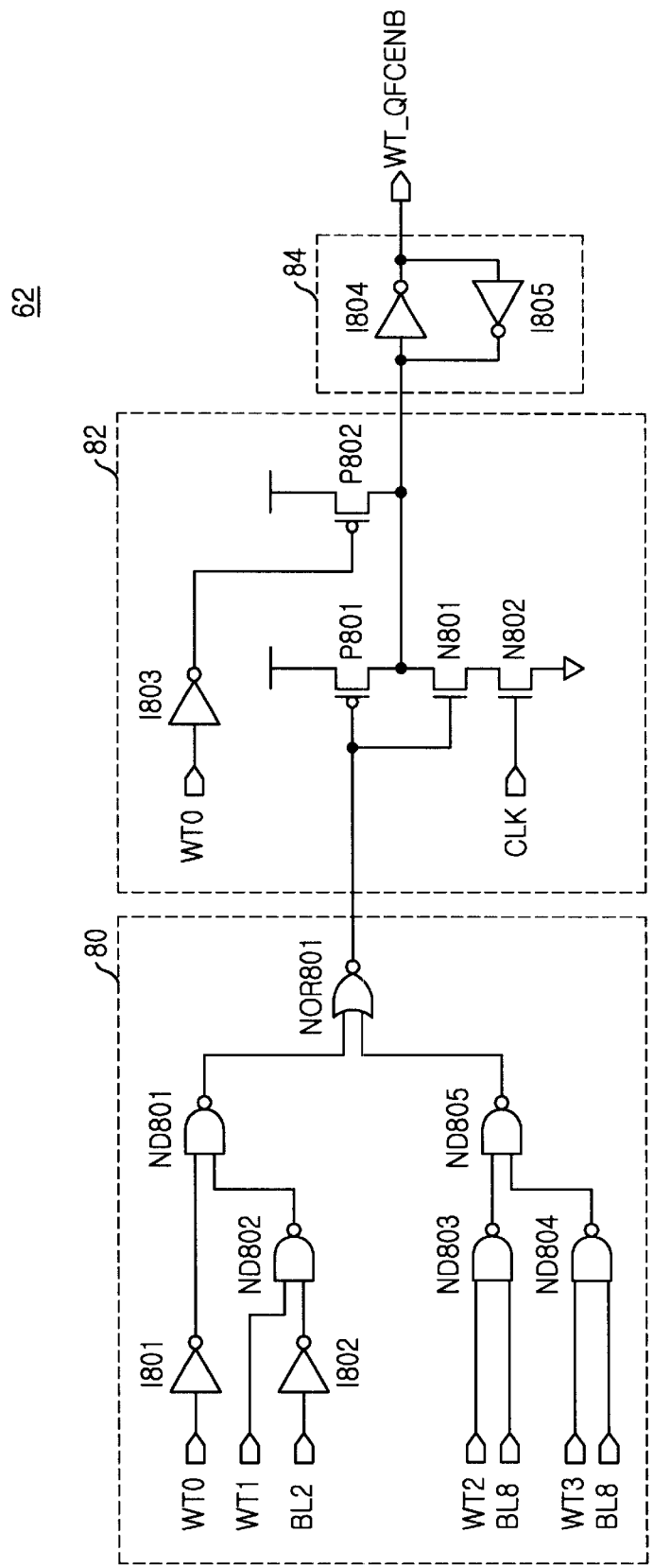
FIG. 8 is a circuit diagram illustrating a QFCB enable signal output unit shown in FIG. 6.

FIG. 8 is a circuit diagram illustrating a QFCB enable signal output unit shown in FIG. 6.

Referring to FIG. 8, the QFCB enable signal output unit 62 includes a logic circuit unit 80, a signal driving unit 82, and a latch unit 84. Here, a reference symbol BL2 represents a burst length of 2 and a reference symbol BL8 represents a burst length of 8, respectively.

In the logic circuit unit 80, the first shift counting signal WT0 is inverted through an inverter I801 to generate an inverted first shift counting signal WT0. The second shift counting signal WT1 and an inverted BL2 signal are NANDed through a NAND gate ND802 and the inverted first shift counting signal WT0 and an output signal from the NAND gate ND802 are NANDed through a NAND gate ND801.

Additionally, the third shift counting signal WT2 and a BL8 signal are NANDed through a NAND gate ND803, and the fourth shift counting signal WT3 and the BL8 signal are NANDed through a NAND gate ND804. An output signal of the NAND gate ND803 and an output signal of the NAND gate ND804 are NANDed through a NAND gate ND805. Then, an output signal of the NAND gate ND801 and an output signal of the NAND gate ND805 are NORed through a NOR gate NOR801.

In the signal driving unit 82, the first shift counting signal WT0 is inverted through an inverter I803 and an output signal is inputted to a gate of a PMOS transistor P802 whose source is coupled to the power terminal. An output signal of the NOR gate NOR801 is inputted to a gate of a PMOS transistor P801 whose source is coupled to the power terminal. Also, the output signal of the NOR gate NOR801 is inputted to a gate of an NMOS gate N801 whose drain is coupled to a drain of the PMOS transistor P801. The internal clock CLK is inputted to a gate of an NMOS transistor N802 whose drain is coupled to a source of the NMOS transistor N802 and whose source is coupled to the ground terminal. Furthermore, a drain of the PMOS transistor P802 is coupled to the drain of the NMOS transistor N801.

The latch unit 84 can be implemented with two inverters I804 and I805, which are cross-coupled to each other. An output signal of the latch circuit 84 corresponds to the QFCB enable signal WT_QFCENB.

At this time, in case where a burst length is 2, the BL2 signal and the BL8 signal are set to a high level and a low level, respectively. In case where a burst length is 8, the BL2 signal and the BL8 signal are set to a low level and a high level, respectively. In FIG. 8, in case where a burst length is 4, both the BL2 and BL8 signals are set to a low level.

Figure 9:
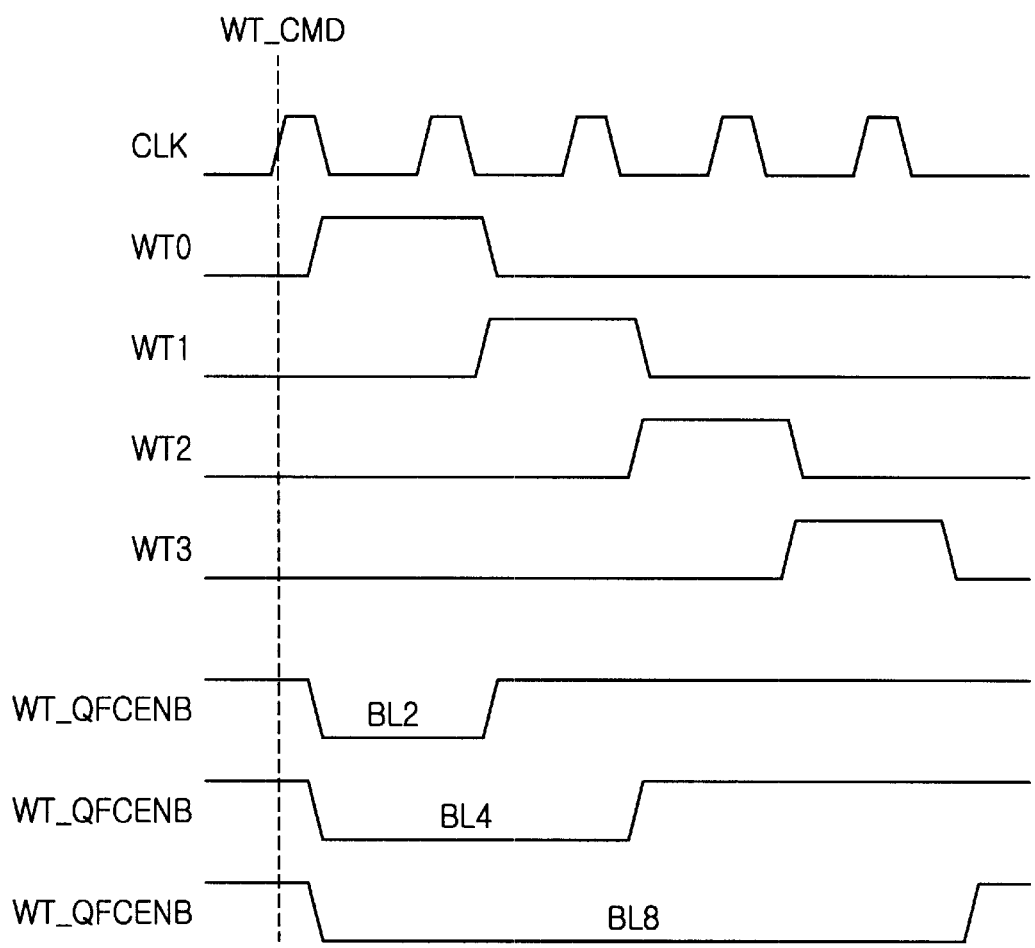
FIG. 9 is a timing chart of QFCB enable signals according to various burst lengths.

FIG. 9 is a timing chart of QFCB enable signals according to various burst lengths.

As shown, in case where a burst length is 2, the second to fourth shift counting signals WT1 to WT3 are blocked and only the first shift counting signal WT0 is processed. In case where a burst length is 4, the third and fourth shift counting signals WT2 and WT3 are blocked and the first and second shift counting signals WT0 and WT1 are processed. In similar manner, in case where a burst length is 8, the first to fourth shift counting signals WT0 to WT3 are processed.

Figure 10:
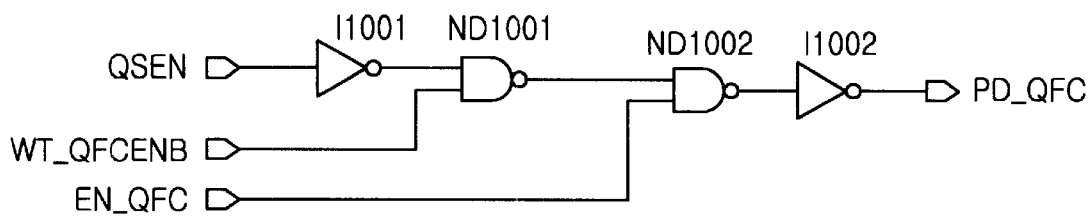
FIG. 10 is a circuit diagram illustrating a pull-down driver shown in FIG. 5.

FIG. 10 is a circuit diagram illustrating a pull-down driver 54 shown in FIG. 5.

As shown, the pull-down driver 54 receives the data strobe enable signal QSEN, the QFCB enable signal WT_QFCENB and the control signal EN_QFC, to generate a pull-down signal PD_QFC.

The data strobe enable signal QSEN is inverted through an inverter I1001, and then, an inverted data strobe enable signal and the QFCB enable signal are NANDed through a NAND gate ND1001. An output signal of the NAND gate ND1001 and the control signal are NANDed through a NAND gate ND1002 and then, an output signal of the NAND gate ND1002 is inverted through an inverter I1002 to thereby generate the pull-down signal PD_QFC.

Figure 11:
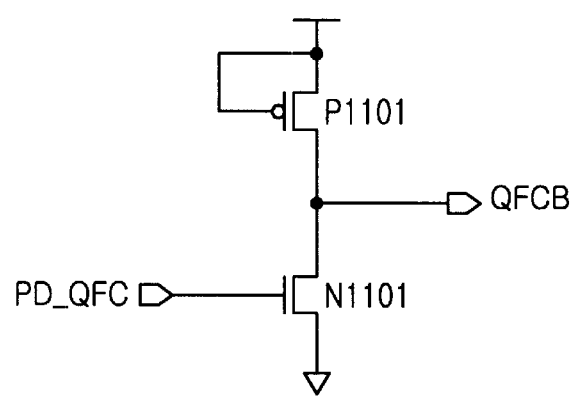
FIG. 11 is a circuit diagram illustrating a QFCB signal output driver shown in FIG. 5.

FIG. 11 is a circuit diagram illustrating a QFCB signal output driver shown in FIG. 5.

The QFCB signal output driver includes a PMOS transistor P1101 having a source coupled to the power terminal and a gate coupled to its source and an NMOS transistor N1101 having a drain coupled to a drain of the PMOS transistor P1101, a source coupled to the ground terminal and a gate receiving the pull-down signal PD_QFC. At this time, the QFCB signal is outputted from the drain of the NMOS transistor N1101.

When the pull-down signal PD_QFC is enabled to a high level, the NMOS transistor N1101 is turned on, so that the QFCB signal is enabled to a low level. Then, the pull-down signal PD_QFC is disabled to a low level, the NMOS transistor N1101 is turned off, so that the QFCB signal becomes a high impedance state.

As described above, although the internal clock is used as a clock signal, it is preferable to use an output signal of a delay lock loop (DLL) circuit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. In a memory module having a plurality of memory chips and a plurality of data switchers on one board in a high speed memory device, each data switcher being selectively turned on or off in response to a switcher control signal to connect corresponding memory chip with a common data bus line, an apparatus for generating the switcher control signal comprising:

a plurality of shift counting means for shift counting a write command signal in response to an internal clock signal and a reset signal, to generate a plurality of shift counting signals;

a switcher enable control signal generating means for receiving the shift counting signals to generate a switcher enable control signal for enabling the switcher control signal during a predetermined time corresponding to a burst length;

a pull down driving means for pulling down the switcher control enable signal to generate a pull-down signal; and an output means for outputting the switcher control signal in response to the pull-down signal.

2. The apparatus as recited in claim 1, further comprising a data strobe enable signal generating means for generating a data strobe enable signal to the pull down driving means according to a column address strobe (CAS) latency in a read operation.

3. The apparatus as recited in claim 2, wherein the switcher control signal is an inverted data strobe enable signal in the read operation.

4. The apparatus as recited in claim 1, wherein the plurality of the shift counting means includes:

a reset clock generating means for generating a reset clock in synchronization with a falling edge of the internal clock;

a first shift counter for receiving the write command signal and the reset clock to generate a first shift counting signal;

a second shift counter for performing a shift counting operation of the first shift counting signal to generate a second shift counting signal;

a third shift counter for performing a shift counting operation of the second shift counting signal to generate a third shift counting signal; and a fourth shift counter for performing a shift counting operation of the third shift counting signal to generate a fourth shift counting signal.

5. The apparatus as recited in claim 4, wherein the reset clock generating means includes:

an inverter for inverting the internal clock to generate an inverted internal clock;

an inverting and delaying unit for inverting and delaying the inverted internal clock for a predetermined time; and a NAND gate for NANDing the inverted internal clock and an output signal of the inverting and delaying unit, to generate the reset clock.

6. The apparatus as recited in claim 4, wherein the first shift counter includes:

a first PMOS transistor having a source coupled to a power terminal and a gate receiving the reset clock;

a second PMOS transistor having a source coupled to a drain of the first PMOS transistor and a gate receiving the write command signal;

an NMOS transistor having a drain coupled to a drain of the second PMOS transistor, a source coupled to a ground terminal and a gate receiving the write command signal; and a latch unit for latching a signal outputted from the drain of the second PMOS transistor from an enabling of the write command to an enabling of the reset clock.

7. The apparatus as recited in claim 6, wherein the second shift counter includes:

a first signal transfer means for transferring the first shift counting signal in response to a rising edge of the internal clock;

a first latch means for latching an output signal of the first signal transfer means in response to the reset signal;

a second signal transfer means for transfer an output signal of the first latch means in response to a falling edge of the internal clock; and a second latch means for latching an output signal of the second signal transfer means in response to the reset signal; and a predetermined number of second inverters for delaying an output signal of the second latch means for a predetermined time, to generate the second shift counting signal.

8. The apparatus as recited in claim 7, wherein the third shift counter includes:

a third signal transfer means for transferring an output signal of the second latch means in response to a rising edge of the internal clock;

a third latch means for latching an output signal of the third signal transfer means in response to the reset signal;

a fourth signal transfer means for transfer an output signal of the third latch means in response to a falling edge of the internal clock; and a fourth latch means for latching an output signal of the fourth signal transfer means in response to the reset signal; and a predetermined number of third inverters for delaying an output signal of the fourth latch means for a predetermined time, to generate the third shift counting signal.

9. The apparatus as recited in claim 8, wherein the fourth shift counter includes:

a fifth signal transfer means for transferring an output signal of the fourth latch means in response to a rising edge of the internal clock;

a fifth latch means for latching an output signal of the fourth signal transfer means in response to the reset signal;

a sixth signal transfer means for transfer an output signal of the fifth latch means in response to a falling edge of the internal clock;

a sixth latch means for latching an output signal of the fifth signal transfer means in response to the reset signal; and a predetermined number of fourth inverters for delaying an output signal of the sixth latch means for a predetermined time, to generate the fourth shift counting signal.

10. The apparatus as recited in claim 7, wherein the first latch means includes:

a NAND gate having a first input terminal receiving the reset signal and a second input terminal receiving the output signal of the first signal transfer means;

a third inverter having an input terminal coupled to an output terminal of the NAND gate and an output terminal coupled to the second input terminal of the NAND gate; and a fourth inverter for inverting an output terminal of the NAND gate.

11. The apparatus as recited in claim 9, wherein the switcher control enable signal generating means includes:

a logic circuit for performing a logic operation of the shift counting signals according to burst lengths;

a driving means for driving an output signal of the logic circuit; and a latch circuit for latching an output signal of the driving means and outputting the switcher enable signal.

12. The apparatus as recited in claim 11, wherein the logic circuit includes:

a fifth inverter for inverting the first shift counting signal;

a sixth inverter for inverting a first burst length signal;

a second NAND gate for NANDing the second shift counting signal and an output signal of the sixth inverter;

a third NAND gate for NANDing an output signal of the fifth inverter and an output signal of the second NAND gate;

a fourth NAND gate for NANDing the third shift counting signal and a second burst length signal;

a fifth NAND gate for NANDing the fourth shift counting signal and the second burst length signal;

a sixth NAND gate for NANDing an output signal of the fourth NAND gate and an output signal of the fifth NAND gate; and a NOR gate for NORing an output signal of the third NAND gate and an output signal of the sixth NAND gate.

13. The apparatus as recited in claim 12, wherein the first burst length is 2 and wherein the second burst length is 8.

14. The apparatus as recited in claim 11, wherein the driving means includes:

a fifth inverter for inverting the first shift counting signal;

a third PMOS transistor having a source coupled to the power terminal and a gate receiving an output signal of the fifth inverter;

a fourth PMOS transistor having a source coupled to the power terminal and a gate receiving an output signal of the logic circuit;

a second NMOS transistor having a drain coupled to a drain of the fourth PMOS transistor and a gate receiving the output signal of the logic circuit; and a third NMOS transistor having a drain coupled to a source of the second NMOS transistor, a source coupled to the ground terminal and a gate receiving the internal clock.

15. The apparatus as recited in claim 1, wherein the pull down driving means further receives a control signal for determining whether to employ the switcher control signal or not.

16. The apparatus as recited in claim 1, wherein the reset signal is a pulse signal for interrupting a write operation due to a burst termination command or a precharge command.

17. The apparatus as recited in claim 15, wherein the pull down driving means includes:

a first inverter for inverting the data strobe enable signal;

a first NAND gate for NANDing an output signal of the first inverter and the switcher enable control signal;

a second NAND gate for NANDing an output signal of the first NAND gate and the control signal; and an inverter for inverting an output signal of the second NAND gate to generate the switcher enable control signal.

18. The apparatus as recited in claim 1, wherein the output means includes:

a PMOS transistor having a source coupled to the power terminal and gate coupled to the source; and an NMOS transistor having a drain coupled to the drain, a source coupled to the ground terminal and a gate receiving the pull down signal.

19. The apparatus as recited in claim 1, wherein the internal clock is an output signal of a delay lock loop (DLL) circuit.

20. The apparatus as recited in claim 1, wherein the memory chip is a double data rate (DDR) synchronous dynamic random access memory (SDRAM).

21. A memory module used in a high speed memory device, comprising:

a plurality of double data rate (DDR) synchronous dynamic random access memory (SDRAM) chips having a switcher control signal generator for generating a switcher control signal; and a plurality of data switchers, wherein each data switcher is selectively turned on or off in response to the switcher control signal to connect corresponding memory chip with a command data bus line, wherein each data switcher including:

a plurality of shift counting means for shift counting a write command signal in response to an internal clock signal and a reset signal, to generate a plurality of shift counting signals;

a switcher enable control signal generating means for receiving the shift counting signals to generate a switcher enable control signal for enabling the switcher control signal during a predetermined time corresponding to a burst length;

a pull down driving means for pulling down the switcher control enable signal to generate a pull-down signal; and an output means for outputting the switcher control signal in response to the pull-down signal.

22. The memory module as recited in claim 21, further comprising a data strobe enable signal generating means for generating a data strobe enable signal to the pull down driving means according to a column address strobe (CAS) latency in a read operation.

23. The apparatus as recited in claim 22, wherein the switcher control signal is an inverted data strobe enable signal in the read operation.

24. The apparatus as recited in claim 21, wherein the plurality of the shift counting means includes:

a reset clock generating means for generating a reset clock in synchronization with a falling edge of the internal clock;

a first shift counter for receiving the write command signal and the reset clock to generate a first shift counting signal;

a second shift counter for performing a shift counting operation of the first shift counting signal to generate a second shift counting signal;

a third shift counter for performing a shift counting operation of the second shift counting signal to generate a third shift counting signal; and a fourth shift counter for performing a shift counting operation of the third shift counting signal to generate a fourth shift counting signal.

* * * * *